(12) United States Patent
Shin et al.

(10) Patent No.: US 8,894,871 B2
(45) Date of Patent: Nov. 25, 2014

(54) LITHOGRAPHY METHOD USING TILTED EVAPORATION

(75) Inventors: Yong Beom Shin, Daejeon (KR); Seung Woo Lee, Gyeongsangnam-do (KR)

(73) Assignee: Korea Research Institute of Bioscience and Biotechnology, Daejeon (KR)

( * ) Notice: Subject to any disclaimer, the term of this patent is extended or adjusted under 35 U.S.C. 154(b) by 126 days.

(21) Appl. No.: 13/500,834

(22) PCT Filed: Nov. 10, 2010

(86) PCT No.: PCT/KR2010/007902
§ 371 (c)(1),
(2), (4) Date: May 29, 2012

(87) PCT Pub. No.: WO2011/090262
PCT Pub. Date: Jul. 28, 2011

(65) Prior Publication Data
US 2012/0234792 A1    Sep. 20, 2012

(30) Foreign Application Priority Data
Jan. 22, 2010    (KR) ................... 10-2010-0006078

(51) Int. Cl.
| H01L 21/00 | (2006.01) |
| H01L 21/027 | (2006.01) |
| G03F 7/00 | (2006.01) |
| G03F 7/40 | (2006.01) |

(52) U.S. Cl.
CPC .......... *H01L 21/0272* (2013.01); *G03F 7/0035* (2013.01); *G03F 7/40* (2013.01); *G02B 2207/101* (2013.01)
USPC ......................................... 216/72

(58) Field of Classification Search
CPC ............ H01L 21/0272; H01L 21/0274; H01L 21/0332; H01L 21/0337; H01L 21/312; H01L 21/033; G03F 7/0035; G03F 7/40; H05K 3/048
USPC ......... 216/11, 41, 44, 72; 21/121.2; 29/592.1; 359/485.05; 427/552; 428/835.5; 430/314; 438/689, 706
See application file for complete search history.

(56) References Cited

U.S. PATENT DOCUMENTS 3,873,361 A * 3/1975 Franco et al. .................. 430/324
4,275,286 A * 6/1981 Hackett, Jr. ................. 219/121.2
(Continued)

FOREIGN PATENT DOCUMENTS

KR     10-2003-0072199 A     9/2003
KR       1020070091314 A     9/2007
(Continued)

OTHER PUBLICATIONS

International Search Report mailed Jul. 14, 2011, in corresponding International Application No. PCT/KR2010/007902, filed Nov. 10, 2010, 4 pages.

*Primary Examiner* — Duy Deo
*Assistant Examiner* — Erin Bergner
(74) *Attorney, Agent, or Firm* — Christensen O'Connor Johnson Kindness PLLC

(57) ABSTRACT

The present invention relates to a lithography method using tilted evaporation, and includes: (1) coating a resist on top of a substrate; (2) patterning the resist using a lithography process; (3) tilt-evaporating a first thin film material on an upper layer of the patterned resist to form a modified pattern mask; (4) evaporating a second thin film material on the top of the substrate with the modified pattern mask; and (5) removing the resist coated on the top of the substrate.

18 Claims, 10 Drawing Sheets

(56) References Cited

U.S. PATENT DOCUMENTS

| | | | |
|---|---|---|---|
| 4,529,686 A * | 7/1985 | Kraus | 430/314 |
| 4,560,641 A * | 12/1985 | Kokaku et al. | 430/312 |
| 4,687,730 A * | 8/1987 | Eron | 430/324 |
| 6,256,455 B1 * | 7/2001 | Chih | 392/441 |
| 7,351,346 B2 | 4/2008 | Little | |
| 7,416,837 B2 | 8/2008 | Nozaki | |
| 7,561,332 B2 | 7/2009 | Little | |
| 7,935,262 B2 | 5/2011 | Nagata | |
| 2001/0016407 A1 * | 8/2001 | Schoenfeld et al. | 438/618 |
| 2008/0160431 A1 * | 7/2008 | Scott et al. | 430/5 |
| 2008/0190656 A1 * | 8/2008 | Cheeke et al. | 174/260 |

FOREIGN PATENT DOCUMENTS

| | | |
|---|---|---|
| KR | 10-0858137 B1 | 9/2008 |
| KR | 1020090042136 A | 4/2009 |

* cited by examiner

LITHOGRAPHY METHOD USING TILTED EVAPORATION

TECHNICAL FIELD

The present invention relates to a lithography method using tilted evaporation, and more particularly to a lithography method using tilted evaporation in which a modified pattern mask is formed using tilted evaporation on the upper layer of a resist pattern which functions as an intermediary layer for pattern transfer to a substrate thus increasing the efficiency of pattern transfer, and also in which the tilted evaporation angle, direction and thickness are adjusted, thereby forming nanopatterns having a variety of shapes.

BACKGROUND ART

Recently with recent developments of techniques for manufacturing nanostructures, thorough research into the specific physical phenomena of the nanostructures is ongoing and applications thereof are greatly increasing. The nanostructure may be manufactured to be of a top-down type or a bottom-up type. In particular, a top-down type (a kind of semiconductor processing refinement technique for further reducing dimensions) is advantageous because well-aligned nanostructures are more reproducibly manufactured, increasing the industrial applicability thereof. Moreover, research into decreasing the size of nanopatterns or forming nanopatterns having various shapes and constructions to increase availability of the nanostructures is active and ongoing.

More particularly, a top-down type is a pattern transfer method comprising forming a resist pattern mask on a substrate using various lithography processes and transferring the pattern onto the substrate using evaporation or etching, and may be classified as either traditional lithography or non-traditional lithography depending on whether or not the mask pattern is formed using the properties of beams.

Typically, nanopatterns formed on a substrate are dependent on a mask pattern formed using lithography, and such mask pattern plays a role in transferring the same pattern onto the substrate that is positioned thereunder. The nanopatterns thus transferred undesirably suffer from pattern limitations due to the properties of lithography.

For example, in the case of using beams, diffraction of beams or scattering (approach effects) of electrons between the resist and the substrate make it difficult to form high-resolution nanopatterns. The case of using colloidal particles is disadvantageous in terms of the shape of nanopatterns being limited and the array of such patterns being incomplete owing to self-assembling properties.

Taking into consideration at the above problems, the present inventors introduced tilted evaporation on a resist pattern mask, to be used with resist pattern masks that have been used as an intermediary layer for pattern transfer to date, in order to supplement many limitations of lithography, thereby modifying the upper pattern of the resist pattern mask, making it possible to perform additional lithography, which culminated in the present invention.

DISCLOSURE

Technical Problem

Accordingly, the present invention has been made keeping in mind the above problems encountered in the related art, and an object of the present invention is to provide a lithography method using tilted evaporation, which enables a modified pattern mask to be formed using tilted evaporation on the upper layer of a resist pattern applied on a substrate, thus increasing pattern transfer efficiency, wherein the tilted evaporation angle, direction and thickness may be adjusted, thereby forming nanopatterns having a variety of shapes.

Technical Solution

In order to accomplish the above object, an aspect of the present invention provides a lithography method using tilted evaporation, comprising (1) applying a resist on top of a substrate; (2) patterning the resist using a lithography process; (3) tilt-evaporating a first thin film material on an upper layer of the patterned resist thus forming a modified pattern mask; (4) evaporating a second thin film material on the top of the substrate using the modified pattern mask; and (5) removing the resist from the top of the substrate.

FIG. 1 is a flowchart schematically showing a lithography process using tilted evaporation according to the present invention. With reference to FIG. 1, the steps of this method are specified below.

(1) Applying a Resist on Top of a Substrate (S11)

As used herein, the term "substrate" means any kind of plate on which a resist may be applied or a nanopattern-forming material may be evaporated. Specifically the substrate may be selected from the group consisting of glass, quartz, silicon, silicon oxide, metal, metal oxide, plastic and mixtures thereof. However, it is noted that the kind of substrate is not particularly limited as long as the resist is applied or the nanopattern-forming material is evaporated thereon.

As used herein, the term "resist" means a polymer material the properties of which change due to light or heat, and a variety of types of resist may be used depending on the kind of lithography. Specifically, the resist may be selected from the group consisting of a positive-type photosensitive resin, a negative-type photosensitive resin, a thermoplastic resin and a thermosetting resin.

Meanwhile, applying the resist on the top of the substrate may be conducted using any known method, and such a method is not particularly limited as long as the resist may be uniformly applied on the top of the substrate so that stains are not formed thereon.

(2) Patterning the Resist Using a Lithography Process (S12)

The resist applied on the top of the substrate in S11 is patterned using a lithography process. As such, a user may pattern the resist so as to impart the resist with a variety of shapes.

The patterning of the resist using a lithography process in S12 may be performed using a lithography process selected from the group consisting of light lithography, E-beam lithography, light projection lithography, extreme ultraviolet lithography, X-ray lithography, holography and nano-imprint lithography, but is not necessarily limited thereto.

(3) Tilt-Evaporating a First Thin Film Material on the Upper Layer of the Patterned Resist to Form a Modified Pattern Mask (S13)

As used herein, the term "tilted evaporation" refers to the substrate which is tilted so that a thin film material, namely, an evaporation material used for tilted evaporation, is not evaporated on the portions at the top of the substrate where the resist was removed but is evaporated only on the upper layer of the patterned resist.

As such, the tilted evaporation may be performed using E-beam evaporation or thermal evaporation, but is not necessarily limited thereto.

Also, the first thin film material may be selected from the group consisting of Cr, Ti, Au, Ag, Pt, Pd, Ni, Al, Cu, $TiO_2$, $SiO_2$, $Al_2O_3$ and mixtures thereof, but is not necessarily limited thereto, and may be appropriately selected depending on the kind of etching process or nanostructure.

Briefly, S13 is tilt-evaporating the first thin film material on the upper layer of the patterned resist thus forming the modified pattern mask.

The tilted evaporation angle, direction and thickness may be set as desired by a user, thereby forming nanopatterns having a variety of sizes and shapes.

Preferably, the tilted evaporation enables the substrate to be tilted at a tilted evaporation angle in a predetermined range. The tilted evaporation angle in the predetermined range is determined based on any one or more selected from among the shape of the resist pattern, the aspect ratio and the thickness of the resist pattern.

Preferably, when the tilted evaporation direction is i) all directions or four directions separated by 90°, nanopatterns having a cylindrical shape are formed; when the tilted evaporation direction is ii) three directions separated by 120°, nanopatterns having a triangular shape are formed; or when the tilted evaporation direction is iii) two directions separated by 180°, nanopatterns having a bar shape are formed.

Preferably, the thickness resulting from tilted evaporation is identically or differently determined for each tilted evaporation direction, thereby forming nanopatterns having a variety of sizes and shapes.

(4) Evaporating a Second Thin Film Material on the Top of the Substrate Using the Modified Pattern Mask (S14)

In S14, a second thin film material, namely, a nanopattern-forming material that finally forms nanopatterns on the substrate, is evaporated on the top of the substrate including the modified pattern mask formed in S13. Thereby, the second thin film material is evaporated on the modified pattern mask and the top of the substrate other than the modified pattern mask. As such, the evaporation of the second thin film material may be performed using a process selected from the group consisting of sputtering, E-beam evaporation, thermal evaporation, plasma enhanced chemical vapor deposition (PECVD) and low pressure chemical vapor deposition (LPCVD), but is not necessarily limited thereto.

If the resist is left behind on the portion on the top of the substrate where the resist was removed, removing such a resist using $O_2$ plasma etching may be further conducted between (3) and (4).

(5) Removing the Resist from the Top of the Substrate (S15)

Finally, S15 is a lift-off process for removing the resist used as the pattern mask. The substrate is immersed in a resist stripping liquid, for example, acetone, and then ultrasonic vibrations are applied to facilitate the removal of the resist.

Thereby, only nanopatterns are present on the top of the substrate, and nanopatterns having a zero-dimensional cylindrical shape may be formed. Furthermore, the nanopatterns may have the same shape as any one or more selected from among a dot shape, a circular shape, a bar shape, a triangular shape, a rectangular shape and a concentric circular shape.

Preferably between (4) and (5), i) tilt-evaporating the first thin film material on the upper layer of the second thin film material evaporated on the resist to form a re-modified pattern mask; and ii) etching the second thin film material evaporated on the top of the substrate using the re-modified pattern mask may be further carried out. As such, i) and ii) may be repeatedly conducted.

Another aspect of the present invention provides a lithography method using tilted evaporation, comprising (1) evaporating a second thin film material on top of a substrate and applying a resist on the top of the second thin film material; (2) patterning the resist using a lithography process; (3) tilt-evaporating a first thin film material on an upper layer of the patterned resist thus forming a modified pattern mask; (4) etching the second thin film material evaporated on the top of the substrate using the modified pattern mask; and (5) removing the resist from the top of the substrate.

FIG. 2 is a flowchart schematically showing a lithography process using tilted evaporation according to the present invention. Compared to the lithography method using tilted evaporation illustrated in FIG. 1, the lithography method using tilted evaporation of FIG. 2 has the same steps except for (1) evaporating the second thin film material on the top of the substrate and applying the resist on the top of the second thin film material; and (4) etching the second thin film material evaporated on the top of the substrate using the modified pattern mask, and thus the descriptions of the steps that are the same are omitted in the following.

(1) Evaporating a Second Thin Film Material on Top of a Substrate and Applying a Resist on Top of the Second Thin Film Material (S21)

The second thin film material is evaporated on the top of the substrate. Evaporating the second thin film material may be performed using a process selected from among sputtering, E-beam evaporation, thermal evaporation, plasma enhanced chemical vapor deposition (PECVD) and low pressure chemical vapor deposition (LPCVD), but the process is not particularly limited as long as the second thin film material may be uniformly evaporated on the top of the substrate. Subsequently, the resist is applied on the top of the second thin film material using the same method as in S11.

(4) Etching the Second Thin Film Material Evaporated on the Top of the Substrate Using the Modified Pattern Mask (S24)

S24 is a process of etching the second thin film material evaporated on the top of the substrate using the modified pattern mask. As such, etching the second thin film material evaporated on the top of the substrate may be performed using a process selected from among wet etching that is conducted by immersing the substrate in a specific etchant that acts on the second thin film material so as to be etched, and dry etching such as ion milling, RIE (Reactive Ion Etching), and ICP (Inductively Coupled Plasma). However, the etching process is not particularly limited as long as it may etch the portion of the second thin film material evaporated on the top of the substrate other than the portion thereof screened with the modified pattern mask.

Preferably, between (4) and (5), i) tilt-evaporating the first thin film material on the upper layer of the first thin film material to form a re-modified pattern mask; and ii) evaporating the second thin film material on the top of the substrate using the re-modified pattern mask may be further performed, and i) and ii) may be repeatedly conducted.

Advantageous Effects

The lithography method in accordance with the present invention enables a resist pattern mask to be primarily patterned using pre-patterning and then to be secondarily processed using tilted evaporation, thereby increasing availability of lithography, and can also effectively manufacture high-resolution nanopatterns and zero-, one-, or two-dimensional nanostructures having a variety of specific shapes, which were difficult to form using conventional methods.

The lithography method in accordance with the present invention can also be applied regardless of the type of lithography, thus ensuring high availability, forming high-resolution nanopatterns and enabling the formation of nanostructures having a variety of sizes and shapes, which were difficult to achieve using conventional methods. Therefore, this method can be usefully applied to highly sensitive bio/chemical sensors such as LSPR (Localized Surface Plasmon Resonance) or SERS (Surface Enhanced Raman Spectroscopy), memory devices including high-density compact disks, semiconductor devices such as organic thin film transistors or thin film solar light devices, optical devices such as light guides or displays, etc.

DESCRIPTION OF THE REFERENCE NUMERALS IN THE DRAWINGS

Figure 1:
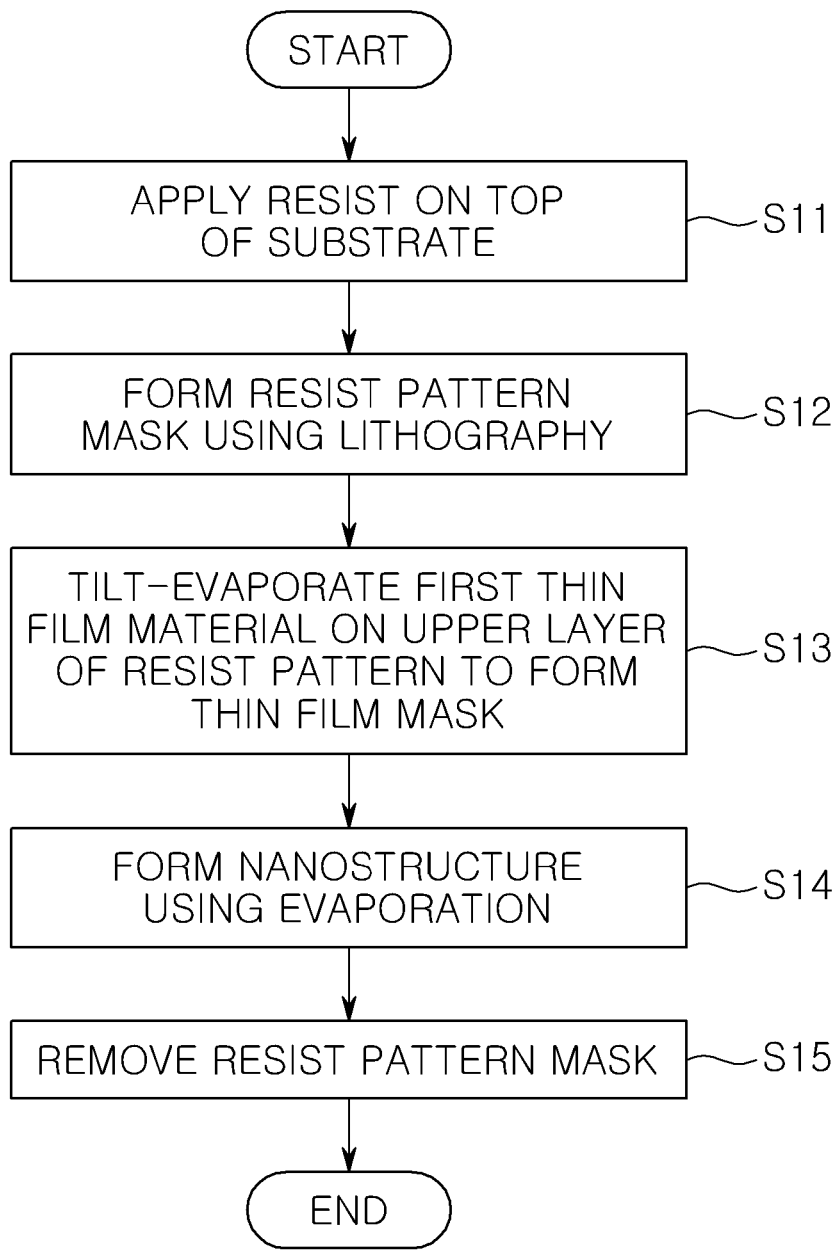
FIG. 1 is a flowchart schematically showing a lithography process using tilted evaporation according to an embodiment of the present invention.
Figure 2:
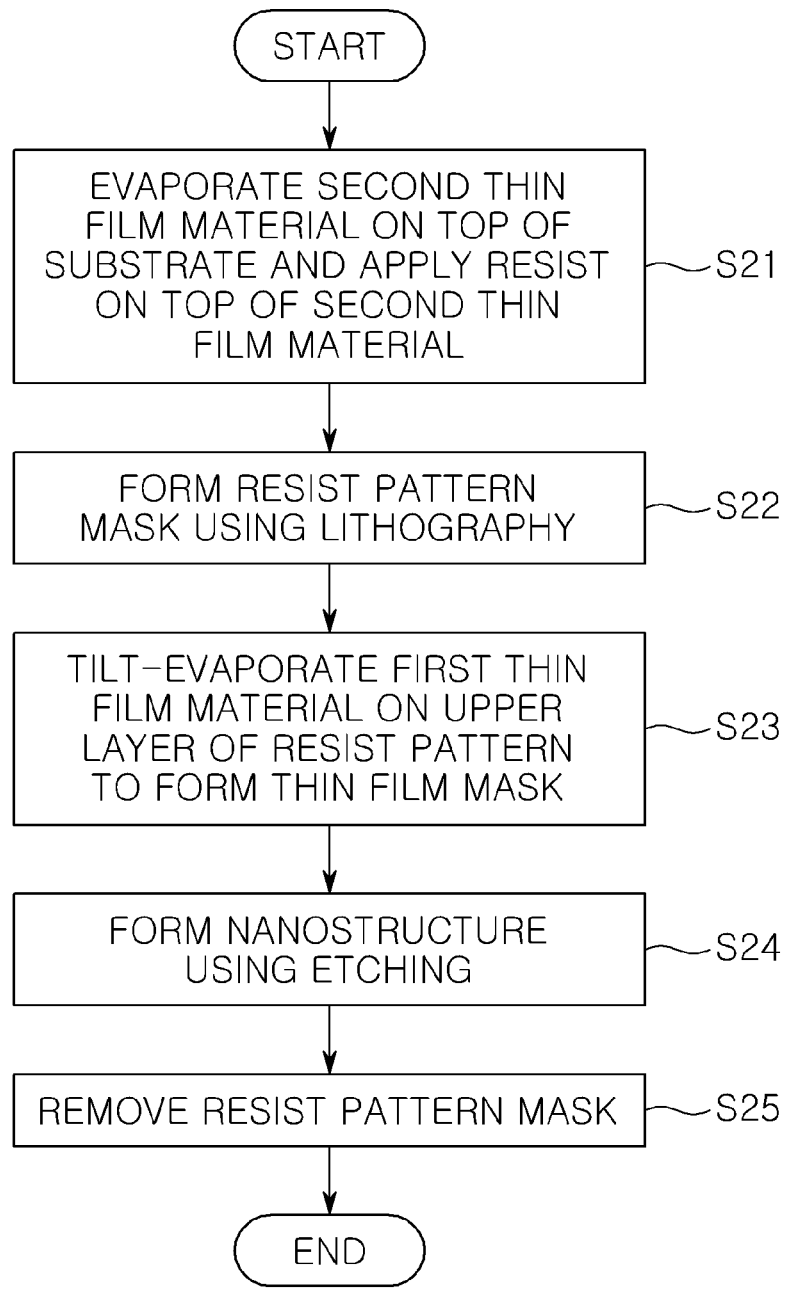
FIG. 2 is a flowchart schematically showing a lithography process using tilted evaporation according to another embodiment of the present invention.

100: substrate
200: resist
210: resist pattern
300: first thin film material
400: second thin film material
410: nanopattern having cylindrical shape
440: nanopattern having ring shape
430: nanopattern having hole shape
450: nanopattern having ring type hole shape Mode For Invention The following examples which are set forth to illustrate, but are not to be construed as limiting, the present invention, may provide a better understanding of the present invention.

EXAMPLE 1

Formation of Nanopatterns Having Zero-Dimensional Cylindrical Shape

Figure 3:
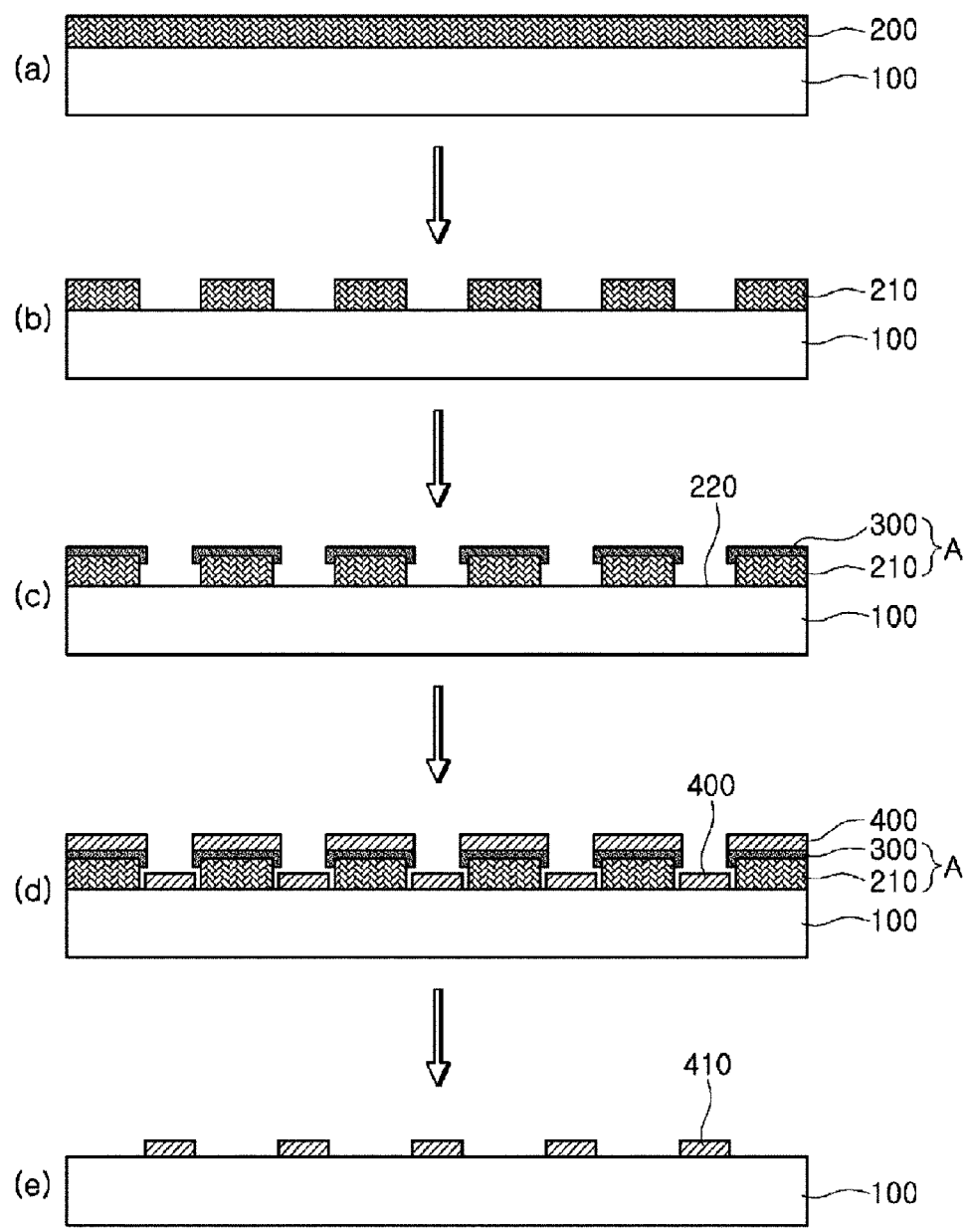
FIG. 3 is of views schematically showing a process of forming nanopatterns having a zero-dimensional cylindrical shape, by means of the lithography process using tilted evaporation according to an embodiment of the present invention.

FIG. 3 schematically illustrates the process of forming nanopatterns having a zero-dimensional cylindrical shape by means of a lithography method using tilted evaporation according to the present invention.

With reference to FIG. 3(a), a substrate 100 is prepared, and a resist 200 is applied on top of the substrate 100. As such, it is preferred that the resist 200 be uniformly applied so that stains are not formed on the top of the substrate 100. Any resist applying method which is typically known may be used.

With reference to FIG. 3(b), the resist 200 applied on the top of the substrate 100 is patterned using a lithography process thus forming a resist pattern 210. As such, a typically known lithography process is utilized, and a user may pattern the resist so as to be imparted with a variety of pattern shapes. In FIG. 3(b), the resist pattern 210 is provided in the form of a cylinder.

With reference to FIG. 3(c), a first thin film material 300 is tilt-evaporated on the upper layer of the resist pattern 210 thus forming a modified pattern mask A. As such, the substrate 100 is tilted at a tilted evaporation angle in the predetermined range so that the first thin film material 300, namely, an evaporation material for use in tilted evaporation, is not evaporated on a portion 220 on the top of the substrate 100 where the resist was removed from but is evaporated only on the upper layer of the resist pattern 210.

The tilted evaporation angle in the predetermined range is preferably determined based on any one or more selected from among the shape of the resist pattern 210, the aspect ratio and the thickness of the resist pattern 210. In particular, although the tilted evaporation angle in the predetermined range may be 30~90°, the angle range of 60~80° may be actually used. Meanwhile, such tilted evaporation may be performed using a process selected from the group consisting of E-beam evaporation and thermal evaporation.

With reference to FIG. 3(d), a second thin film material 400, namely, a material that finally forms nanopatterns on the top of the substrate 100, is evaporated on the modified pattern mask A and the top of the substrate 100. As such, the evaporation may be performed using any known process, and a variety of materials may be adopted as the second thin film material.

With reference to FIG. 3(e), a lift-off process which finally removes the resist pattern 210 is performed. As the resist pattern 210 is removed, the first thin film material 300 and the second thin film material 400 which were tilt-evaporated on the upper layer of the resist pattern 210, are removed together. This process may be typically conducted by immersing the substrate in a resist stripping liquid, for example, acetone and then applying ultrasonic vibrations so that the resist pattern 210 may be easily removed. Thereby, only nanopatterns 410 having a cylindrical shape are left behind on the top of the substrate 100.

Figure 7A:
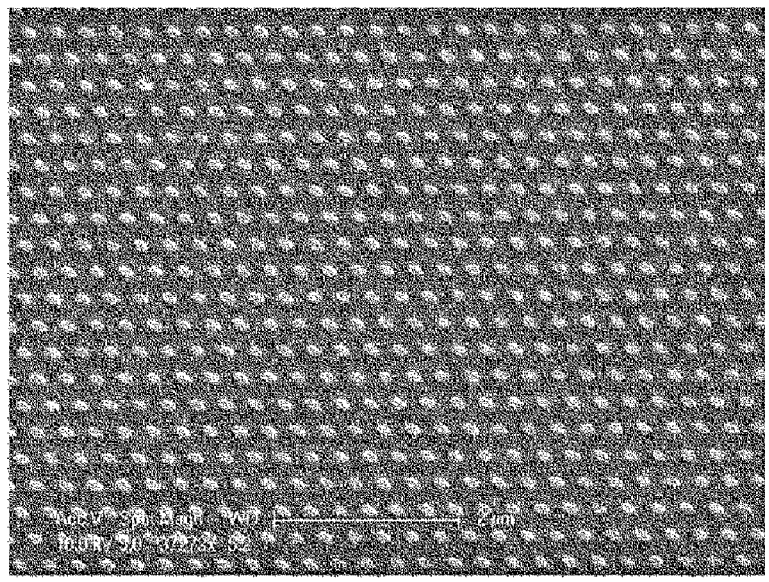
FIGS. 7(a), (b) are images showing the nanopatterns having a zero-dimensional cylindrical shape formed by the lithography process using tilted evaporation according to an embodiment of the present invention.
Figure 7B:
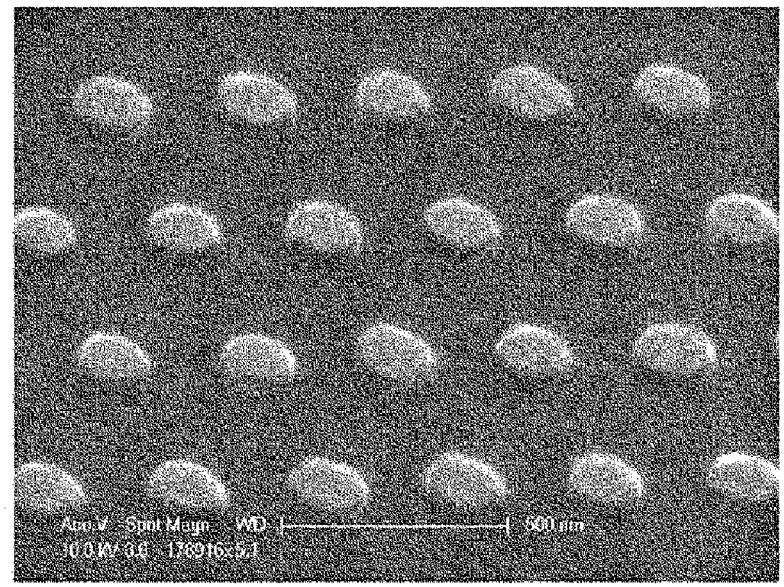

The nanopatterns having a cylindrical shape thus formed are observed using a scanning electron microscope (SEM). The results are shown in (a) and (b) of FIG. 7. With reference to FIG. 7, the cylindrical shape of the nanopatterns can be seen to be very uniform and the size thereof is determined to be about 150 nm.

EXAMPLE 2

Formation of Nanopatterns Having One-Dimensional Ring Shape

Figure 4:
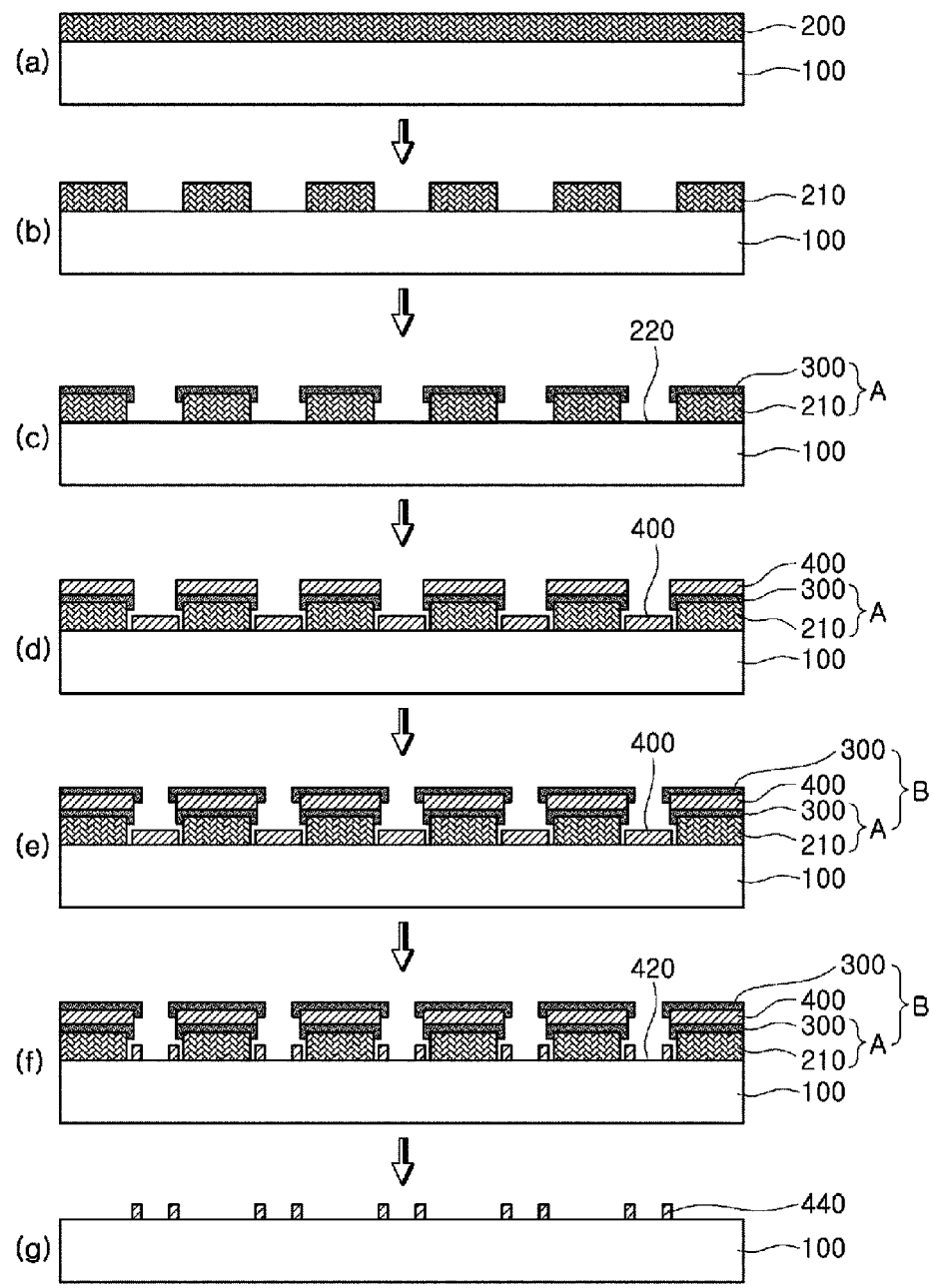
FIG. 4 is of views schematically showing a process of forming nanopatterns having a one-dimensional ring shape, by means of the lithography process using tilted evaporation according to an embodiment of the present invention.

FIG. 4 schematically illustrates a process of forming nanopatterns having a one-dimensional ring shape by means of the lithography method using tilted evaporation according to the present invention. Because FIGS. 4(a), 4(b), 4(c) and 4(d) respectively correspond to FIGS. 3(a), 3(b), 3(c) and 3(d), only FIGS. 4(e), 4(f) and 4(g) are described below.

With reference to FIG. 4(e), the first thin film material 300 is tilt-evaporated on the upper layer of the second thin film material 400 evaporated on the top of the modified pattern mask, thus forming a re-modified pattern mask B. As such, the substrate 100 is tilted so that the first thin film material 300 is not evaporated on the upper layer of the second thin film material 400 evaporated on the top of the substrate 100 but is evaporated only on the upper layer of the second thin film material 400 evaporated on the top of the modified pattern mask A. Such tilted evaporation may be performed using a process selected from the group consisting of E-beam evaporation and thermal evaporation.

With reference to FIG. 4(f), the second thin film material 400 evaporated on the top of the substrate 100 is etched using the re-modified pattern mask B thus forming nanopatterns 440 having a ring shape. This etching may be performed using a process selected from among wet etching that is conducted by immersing the substrate 100 in a specific etchant that works on the second thin film material so as to be etched, and dry etching such as ion milling, RIE, ICP. On the other hand, the etching process is not particularly limited as long as it may etch the portion 420 of the second thin film material 400 evaporated on the top of the substrate 100 other than the portion thereof screened with the re-modified pattern mask B.

With reference to FIG. 4(g), a lift-off process that finally removes the resist pattern 210 is performed. As the resist pattern 210 is removed, the first thin film material 300 and the second thin film material 400 which were tilt-evaporated on the upper layer of the resist pattern 210 are removed together. This process may be typically conducted by immersing the substrate in a resist stripping liquid, for example, acetone, and then applying ultrasonic vibrations so that the resist pattern 210 may be easily removed. Thereby, only the nanopatterns 440 having a ring shape are left behind on the top of the substrate 100.

The steps of FIGS. 4(e) and 4(f) may be repeatedly performed. When these steps are repeated in this way, there may be an increased number of nanopatterns having a ring shape.

Figures 8A, 8B:
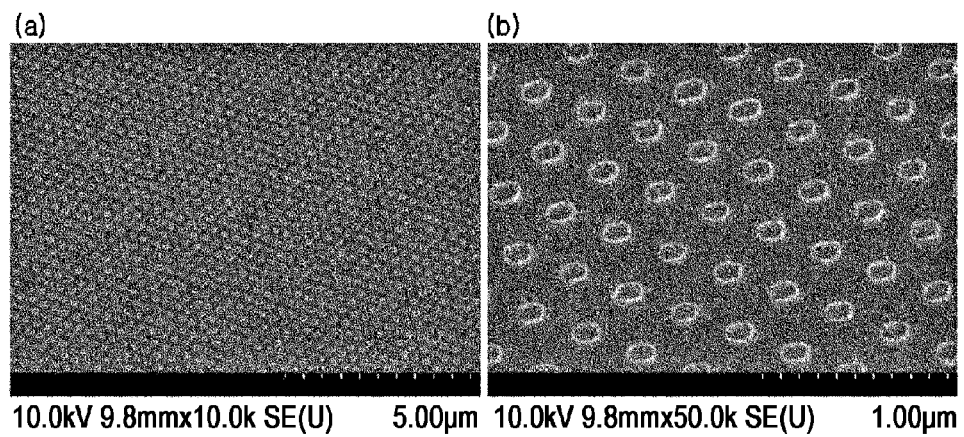
FIGS. 8(a), (b) are images showing the nanopatterns having a one-dimensional ring shape formed by the lithography process using tilted evaporation according to an embodiment of the present invention.

The nanopatterns having a ring shape thus formed are observed using SEM. The results are shown in (a) and (b) of FIG. 8. With reference to FIG. 8, the ring shape of the nanopatterns can be seen to be very uniform and the size thereof is determined to be about 150 nm.

EXAMPLE 3

Formation of Nanopatterns Having Two-Dimensional Hole Shape

Figure 5:
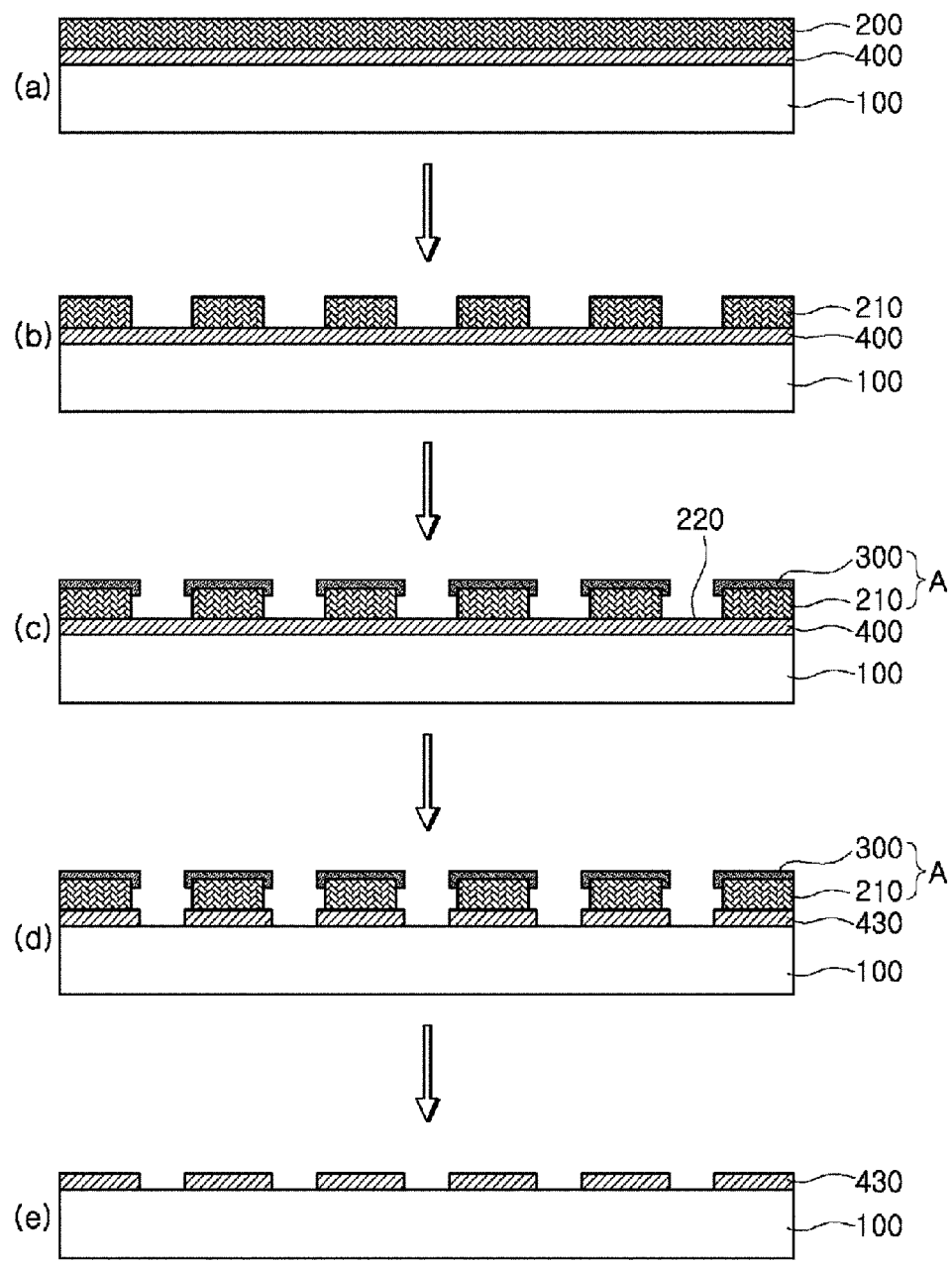
FIG. 5 is of views schematically showing a process of forming nanopatterns having a two-dimensional hole shape, by means of the lithography process using tilted evaporation according to another embodiment of the present invention.

FIG. 5 schematically illustrates a process of forming nanopatterns having a two-dimensional hole shape by means of the lithography method using tilted evaporation according to the present invention.

With reference to FIG. 5(a), a second thin film material 400 is evaporated on top of a substrate 100. Then, a resist 200 is applied on top of the second thin film material 400. As such, evaporation of the second thin film material 400 and application of the resist 200 may be performed using any known method, and the description thereof is omitted.

With reference to FIG. 5(b), the resist 200 is patterned using a lithography process thus forming a resist pattern 210. As such, a typically known lithography process is utilized, and a user may pattern the resist so as to be imparted with a variety of pattern shapes.

With reference to FIG. 5(c), a first thin film material 300 is tilt-evaporated on the upper layer of the resist pattern 210 thus forming a modified pattern mask A. As such, the substrate 100 is tilted so that the first thin film material 300, namely, an evaporation material for use in tilted evaporation, is not evaporated on the portion 220 on the top of the second thin film material 400 where the resist was removed from but is evaporated only on the upper layer of the resist pattern 210.

With reference to FIG. 5(d), the second thin film material 400 evaporated on the top of the substrate 100 is etched using the modified pattern mask thus forming nanopatterns 430 having a hole shape. This etching may be performed using a process selected from among wet etching that is conducted by immersing the substrate 100 in a specific etchant that works on the second thin film material so as to be etched, and dry etching such as ion milling, RIE, ICP.

With reference to FIG. 5(e), a lift-off process which finally removes the resist pattern 210 is performed. As the resist pattern 210 is removed, the first thin film material 300 which was tilt-evaporated on the upper layer of the resist pattern 210 is removed. This process may be typically carried out by immersing the substrate in a resist stripping liquid, for example, acetone, and then applying ultrasonic vibrations so that the resist pattern 210 may be easily removed. Thereby, only the nanopatterns 430 having a hole shape are left behind on the top of the substrate 100.

Figure 9A:
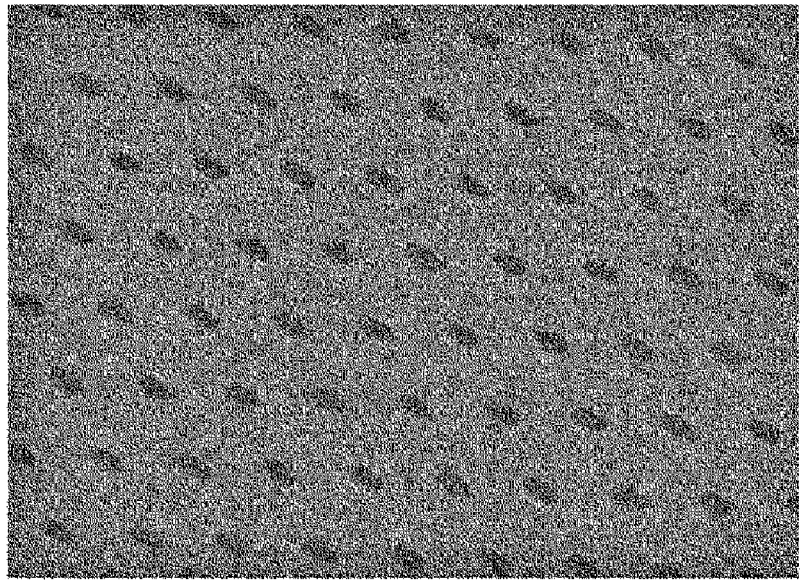
FIGS. 9(a), (b) are images showing the nanopatterns having a two-dimensional hole shape formed by the lithography process using tilted evaporation according to another embodiment of the present invention.
Figure 9B:
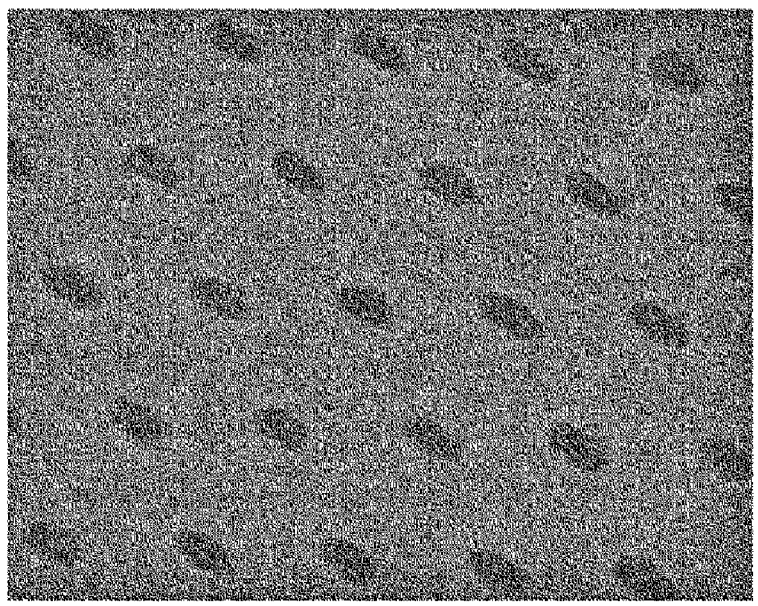

The nanopatterns having a hole shape thus formed are observed using SEM. The results are shown in (a) and (b) of FIG. 9. With reference to FIG. 9, the hole shape of the nanopatterns can be seen to be very uniform in which the portion of the nanopatterns where the hole is formed is represented by black and the portion around the hole is represented by a bright color.

EXAMPLE 4

Formation of Nanopatterns Having Two-Dimensional Ring Type Hole Shape

Figure 6:
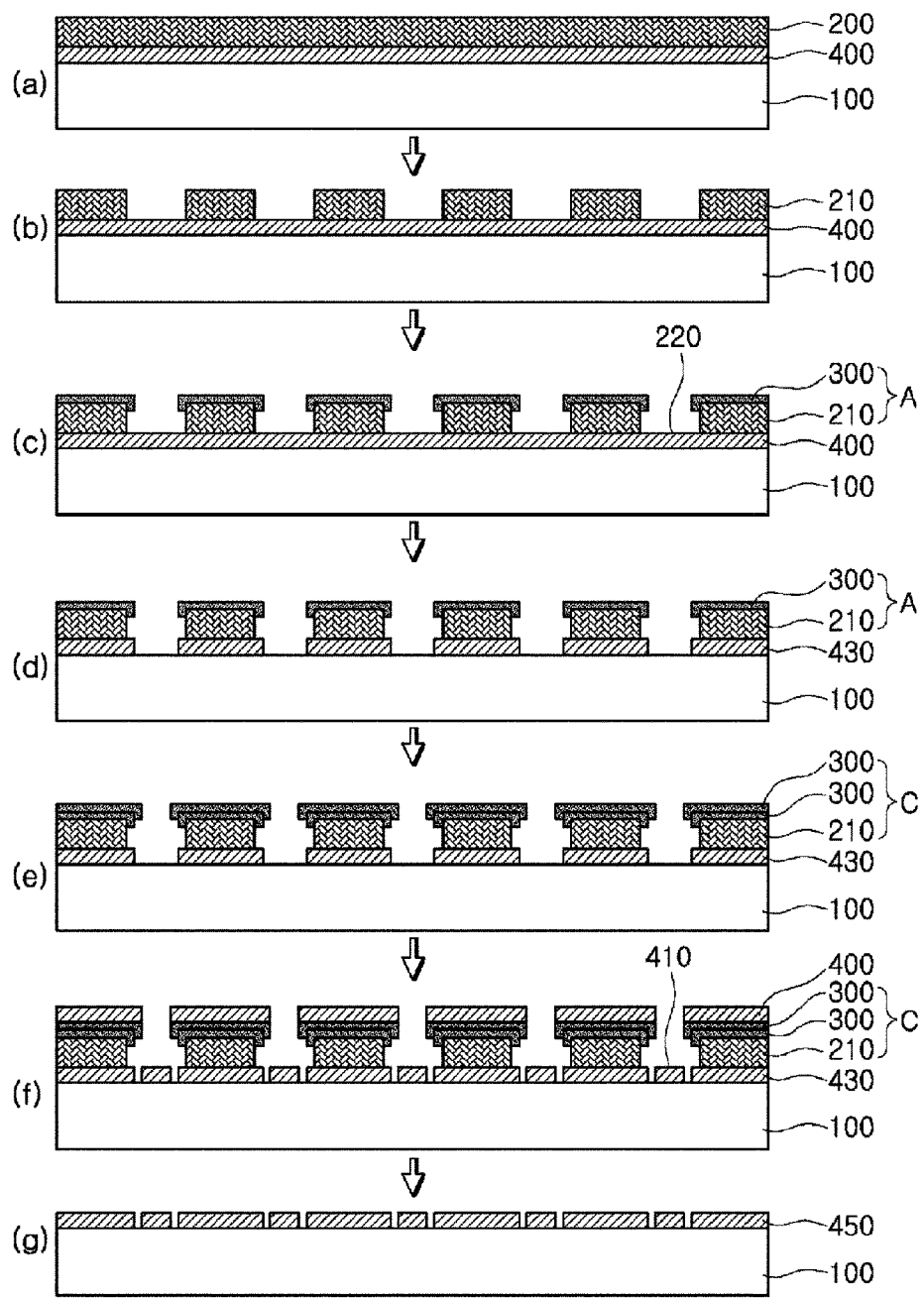
FIG. 6 is of views schematically showing a process of forming nanopatterns having a two-dimensional ring type hole shape, by means of the lithography process using tilted evaporation according to another embodiment of the present invention.

FIG. 6 schematically illustrates a process of forming nanopatterns having a two-dimensional ring type hole shape by means of the lithography method using tilted evaporation according to the present invention. Because FIGS. 6(a), 6(b), 6(c) and 6(d) respectively correspond to FIGS. 5(a), 5(b), 5(c) and 5(d), only FIGS. 6(e), 6(f) and 6(g) are described below.

With reference to FIG. 6(e), the first thin film material 300 is tilt-evaporated again on the upper layer of the first thin film material 300 thus forming a re-modified pattern mask C. The tilted evaporation is performed in the same manner as in a conventional process, and the description thereof is omitted.

With reference to FIG. 6(f), the second thin film material 400 is evaporated again on the top of the substrate 100 using the re-modified pattern mask C thus forming nanopatterns 410 having a cylindrical shape. The evaporation of the second thin film material 400 is performed in the same manner as in a conventional process, and the description thereof is omitted.

With reference to FIG. 6(g), a lift-off process that finally removes the resist pattern 210 is performed. Thereby only nanopatterns 410 having a cylindrical shape and nanopatterns 430 having a hole shape are left behind on the top of the substrate 100, and are referred to as nanopatterns 450 having a ring type hole shape.

The steps of FIGS. 6(e) and 6(f) may be repeatedly performed. When these steps are repeated in this way, there may be an increased number of nanopatterns having a ring type hole shape.

Figures 10A, 10B:
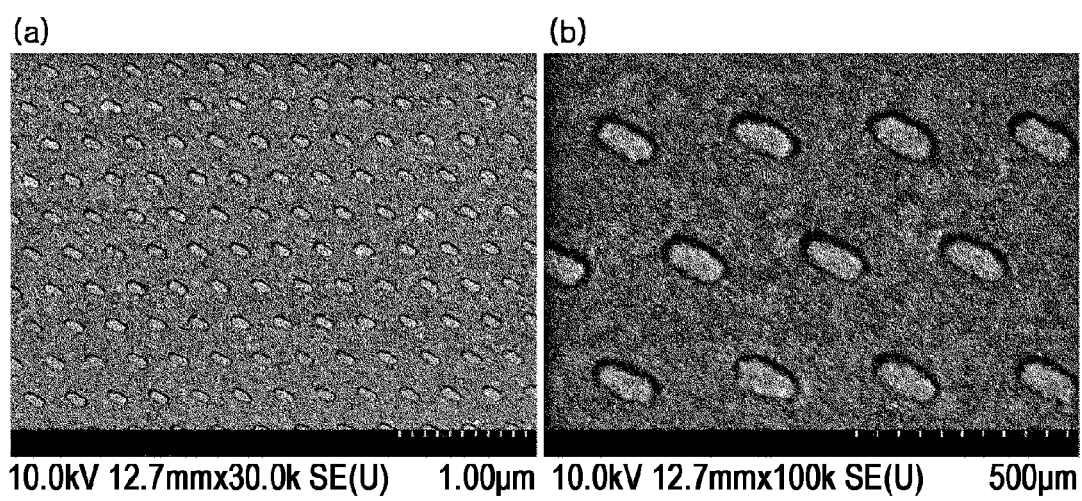
FIGS. 10(a), (b) are images showing the nanopatterns having a two-dimensional ring type hole shape formed by the lithography process using tilted evaporation according to another embodiment of the present invention.

The nanopatterns having a ring type hole shape thus formed are observed using SEM. The results are shown in (a) and (b) of FIG. 10. With reference to FIG. 10, the ring type hole shape of the nanopatterns can be seen to be very uniform and the size thereof is determined to be about 150 nm.

Although the preferred embodiments of the present invention have been disclosed for illustrative purposes, those skilled in the art will appreciate that various modifications, additions and substitutions are possible without departing from the scope and spirit of the invention as disclosed in the accompanying claims.

Industrial Applicability

According to the present invention, a lithography method can be applied regardless of the type of lithography, thus ensuring high availability and forming high-resolution nanopatterns, and also making it possible to form nanostructures having a variety of sizes and shapes which were difficult to achieve using conventional methods. Therefore, this method can be applied to highly sensitive bio/chemical sensors such as LSPR or SERS, memory devices including high-density compact disks, semiconductor devices such as organic thin film transistors or thin film solar light devices, optical devices such as light guides or displays, etc.

The invention claimed is:

1. A lithography method using tilted evaporation, comprising:
   (a) applying a resist on top of a substrate;
   (b) patterning the resist using a lithography process thus forming a patterned resist and portions on the top of the substrate where the resist is removed;
   (c) tilt-evaporating a first thin film material on an upper layer of the patterned resist thus forming a modified pattern mask;
   (d) evaporating a second thin film material on the top of the substrate using the modified pattern mask;
   (e) tilt-evaporating the material of the first thin film on an upper layer of the second thin film material evaporated on the resist thus forming a re-modified pattern mask;
   (f) etching the second thin film material evaporated on the top of the substrate using the re-modified pattern mask; and
   (g) removing the resist from the top of the substrate.

2. The lithography method of claim 1, wherein (e) and (f) are repeatedly performed.

3. A lithography method using tilted evaporation, comprising:
   (a) evaporating a second thin film material on top of a substrate and applying a resist on top of the second thin film material;
   (b) patterning the resist using a lithography process thus forming a patterned resist;
   (c) tilt-evaporating a first thin film material on an upper layer of the patterned resist thus forming a modified pattern mask;
   (d) etching the material of the second thin film evaporated on the top of the substrate using the modified pattern mask;
   (e) tilt-evaporating the material of the first thin film on an upper layer of the first thin film material thus forming a re-modified pattern mask;
   (f) evaporating the material of the second thin film on the top of the substrate using the re-modified pattern mask; and
   (g) removing the resist from the top of the substrate.

4. The lithography method of claim 3, wherein (e) and (f) are repeatedly performed.

5. The lithography method of claim 1, wherein the substrate is selected from the group consisting of glass, quartz, silicon, silicon oxide, metal, metal oxide, plastic and mixtures thereof.

6. The lithography method of claim 1, wherein the resist is selected from the group consisting of a positive-type photosensitive resin, a negative-type photosensitive resin, a thermoplastic resin and a thermosetting resin.

7. The lithography method of claim 1, wherein the patterning using the lithography process in (b) is performed using a lithography process selected from the group consisting of light lithography, E-beam lithography, light projection lithography, extreme ultraviolet lithography, X-ray lithography, holography and nano-imprint lithography.

8. The lithography method of claim 1, wherein the tilted evaporation is performed using E-beam evaporation or thermal evaporation.

9. The lithography method of claim 1, wherein the first thin film material is selected from the group consisting of Cr, Ti, Au, Ag, Pt, Pd, Ni, Al, Cu, $TiO_2$, $SiO_2$, $Al_2O_3$ and mixtures thereof.

10. The lithography method of claim 1, wherein the evaporating the second thin film material on the top of the substrate is performed using a process selected from the group consisting of sputtering, E-beam evaporation, thermal evaporation, plasma enhanced chemical vapor deposition (PECVD) and low pressure chemical vapor deposition (LPCVD).

11. The lithography method of claim 1, wherein when there exists a resist residue on the substrate other than the patterned resist, removing the resist residue using $O_2$ plasma etching is further performed between (c) and (d).

12. The lithography method of claim 1, wherein the etching the second thin film material evaporated on the top of the substrate is performed using wet etching or dry etching selected from the group consisting of ion milling, RIE (Reactive Ion Etching), and ICP (Inductively Coupled Plasma).

13. The lithography method of claim 1, wherein (g) is performed by immersing the substrate in a resist stripping liquid and then applying ultrasonic vibrations.

14. The lithography method of claim 1, wherein a tilted evaporation angle, direction and thickness are adjusted upon tilted evaporation, so that a nanopattern having a variety of sizes and shapes is formed.

15. The lithography method of claim 14, wherein the tilted evaporation is performed only on the upper layer of the patterned resist at the tilted evaporation angle in a predetermined range.

16. The lithography method of claim 15, wherein the predetermined range of the tilted evaporation angle is 30~90°.

17. The lithography method of claim 14, wherein when the tilted evaporation direction is i) all directions or four directions separated by 90°, a nanopattern having a cylindrical shape is formed; when the tilted evaporation direction is ii) three directions separated by 120°, a nanopattern having a triangular shape is formed; or when the tilted evaporation direction is iii) two directions separated by 180°, a nanopattern having a bar shape is formed.

18. The lithography method of claim 14, wherein the nanopattern has any one or more shapes selected from among a dot shape, a cylindrical shape, a circular shape, a bar shape, a triangular shape, a rectangular shape and a concentric circular shape.

\* \* \* \* \*